(12) United States Patent
Kobayashi et al.

(10) Patent No.: US 9,390,986 B2
(45) Date of Patent: Jul. 12, 2016

(54) POLISHING APPARATUS AND POLISHING METHOD

(71) Applicant: EBARA CORPORATION, Tokyo (JP)

(72) Inventors: Yoichi Kobayashi, Tokyo (JP); Keita Yagi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/637,282

(22) Filed: Mar. 3, 2015

(65) Prior Publication Data

US 2015/0255357 A1    Sep. 10, 2015

(30) Foreign Application Priority Data

Mar. 5, 2014  (JP) ................. 2014-042714

(51) Int. Cl.
| | |
|---|---|
| *H01L 21/66* | (2006.01) |
| *B24B 37/005* | (2012.01) |
| *B24B 49/10* | (2006.01) |
| *B24B 49/12* | (2006.01) |
| *H01L 21/306* | (2006.01) |
| *H01L 21/67* | (2006.01) |

(52) U.S. Cl.
CPC .............. *H01L 22/26* (2013.01); *B24B 37/005* (2013.01); *B24B 49/105* (2013.01); *B24B 49/12* (2013.01); *H01L 21/30625* (2013.01); *H01L 21/67063* (2013.01); *H01L 21/67092* (2013.01); *H01L 22/12* (2013.01)

(58) Field of Classification Search
CPC .............. H01L 22/26; H01L 21/30625; H01L 21/67063; H01L 21/67092; B24B 37/005; B24B 49/105; B24B 49/12

USPC ............................................. 438/5
See application file for complete search history.

(56) References Cited

U.S. PATENT DOCUMENTS

2010/0029177 A1* 2/2010 Kobayashi .............. B24B 37/04
                                                        451/5
2012/0276661 A1* 11/2012 Iravani .................... H01L 22/14
                                                         438/10

FOREIGN PATENT DOCUMENTS

| JP | 2008-503356 | 2/2008 |
|---|---|---|
| WO | WO 2008/032753 A1 | 3/2008 |

* cited by examiner

*Primary Examiner* — Fernando L Toledo
*Assistant Examiner* — Adam S Bowen
(74) *Attorney, Agent, or Firm* — Baker & Hostetler LLP

(57) ABSTRACT

A polishing apparatus capable of achieving a good control operation for a distribution of remaining film thickness is disclosed. The polishing apparatus includes: a top ring configured to apply pressures separately to zones on a back surface of a substrate to press a front surface of the substrate against a polishing pad; a film-thickness sensor configured to obtain a film-thickness signal that varies in accordance with a film thickness of the substrate; and a polishing controller configured to manipulate the pressures. The polishing controller calculates indexes of a remaining film thickness in zones on the front surface of the substrate, manipulate the pressures based on the indexes for controlling a distribution of the remaining film thickness, and update at least one of control parameters using polishing data obtained during polishing of the substrate.

12 Claims, 9 Drawing Sheets

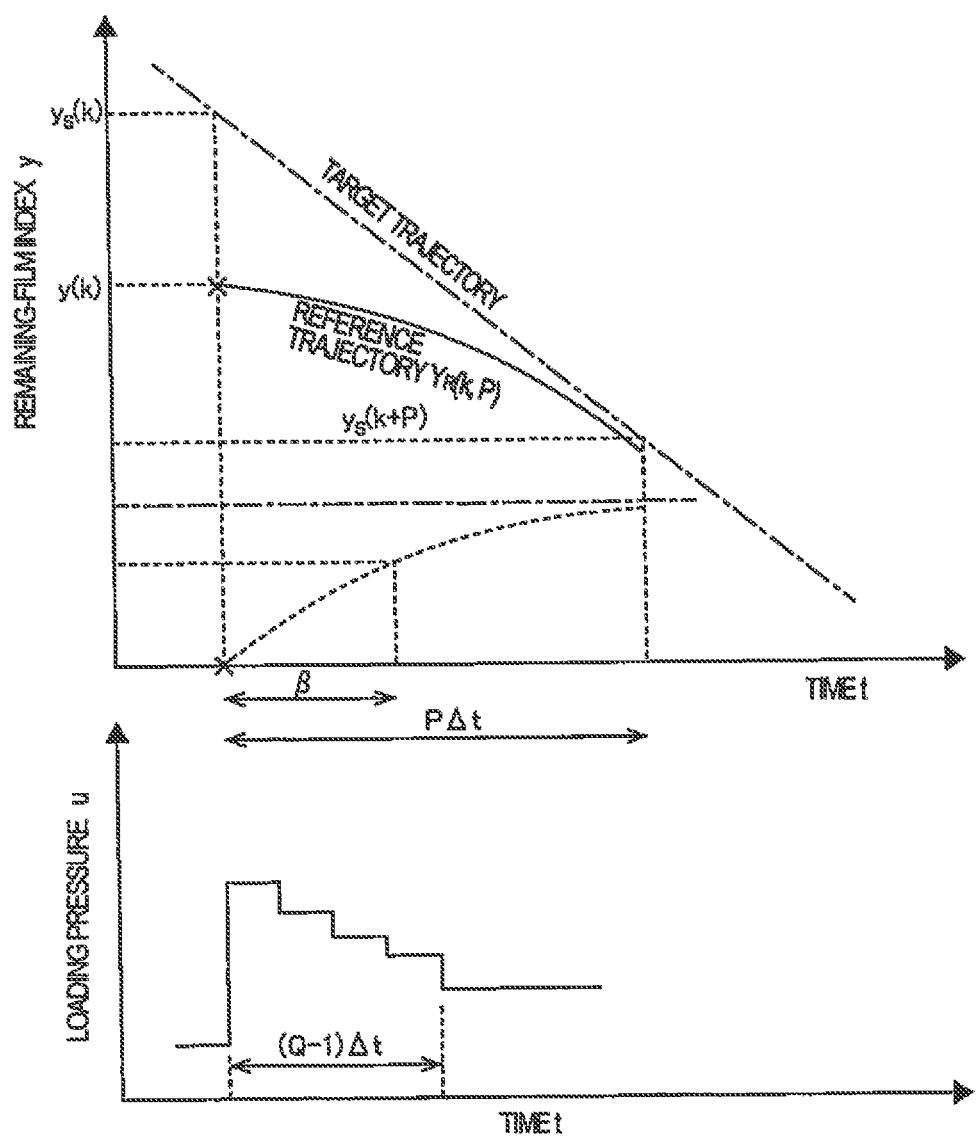

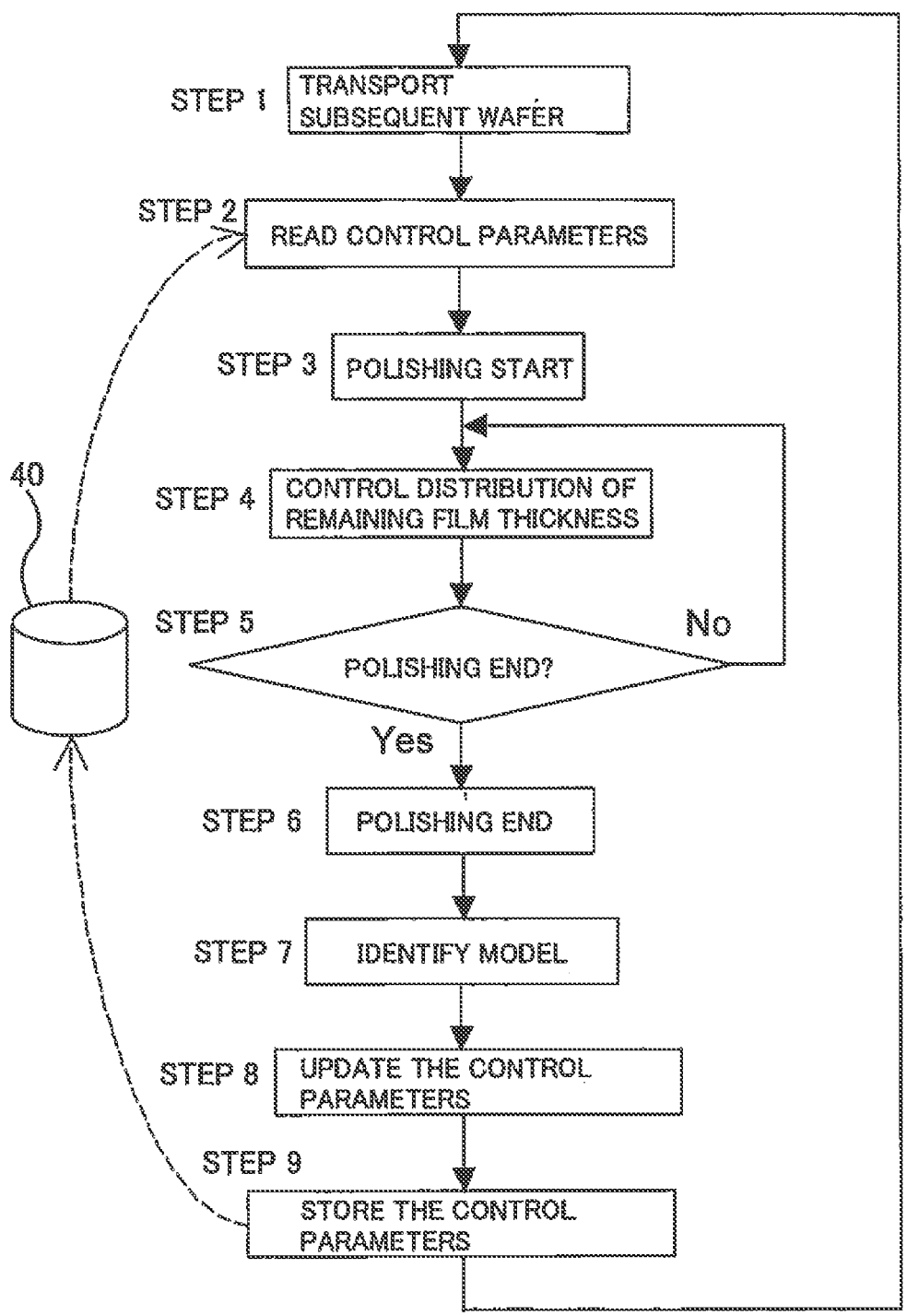

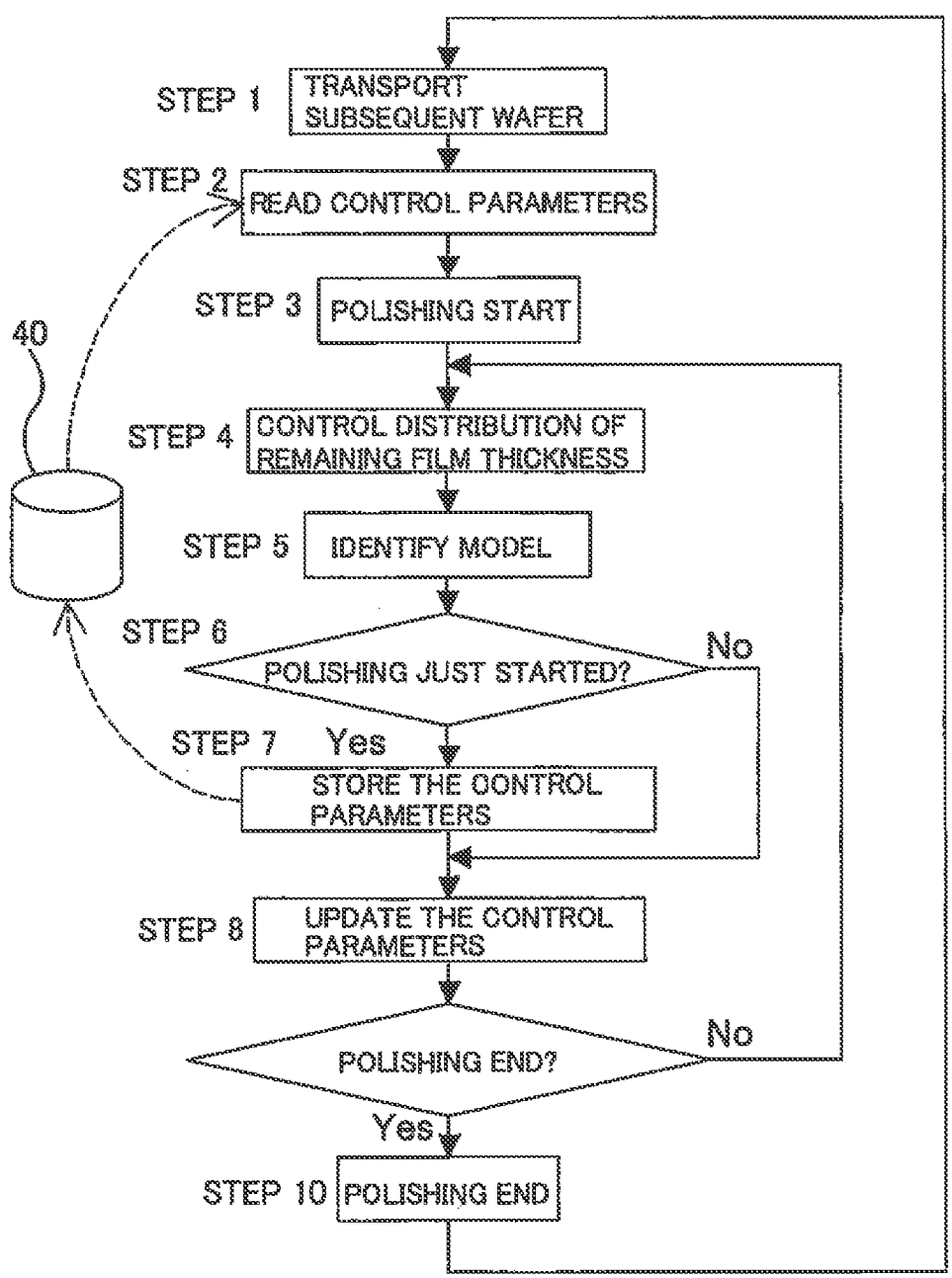

POLISHING APPARATUS AND POLISHING METHOD

CROSS REFERENCE TO RELATED APPLICATION

This document claims priority to Japanese Patent Application Number 2014-042714 filed Mar. 5, 2014, the entire contents of which are hereby incorporated by reference.

BACKGROUND

In a manufacturing process of semiconductor devices, film-thickness information is monitored during polishing of a film that forms a front surface of a wafer. During polishing, pressures, applied to multiple zones on a back surface of the wafer, are manipulated to control a distribution of remaining film thickness. For example, Japanese laid-open patent publication No. 2008-503356 and International patent publication No. 2008/032753 disclose such a technique.

In this control operation of the distribution of remaining film thickness, it is important to correctly grasp an influence on a polishing rate resulting from a change in the pressure against the wafer back surface (e.g., characteristics including a dead time of a response, a response lag, a process gain which is a ratio of the polishing rate to the pressure) and to determine control parameters based on these characteristics. The control parameters are condition values that determine a controlling operation. For example, the control parameters include a proportional gain, an integral gain, and a derivative gain in PID control. In a model predictive control, the control parameters include a constant of proportionality in a prediction model and a response lag. It has been a conventional practice to use empirically-selected values as the control parameters, or estimate a part of the control parameters by polishing a sample wafer having the same structure as a product wafer, because there is a constraint in use of individual product wafers and there is a difficulty in measurement of the film thickness.

However, even if the same pressure is exerted on back surfaces of wafers, an actual polishing rate (or removal rate) may vary between wafers, due to variations in conditions of consumables, such as a polishing pad and a retaining ring, and a variation in material of the film to be polished. Moreover, even when polishing one wafer, the removal rate may vary as a result of a change in a characteristic of an exposed layer (e.g., oxidation), removal of surface steps (e.g., surface irregularity), or an increase in wafer temperature in a latter half of polishing.

Therefore, if constant control parameters are used for the polishing control operation, such control parameters may not be suited to current process characteristics at each point in time. As a result, manipulated variables, such as a change in the pressure, may be unsuitable, and controllability may be lowered.

SUMMARY OF THE INVENTION

Embodiments, which will be described below, provide a polishing apparatus and a polishing method capable of achieving a good control operation for a distribution of remaining film thickness, regardless of a change in process characteristics. The embodiments relate to a polishing apparatus and a polishing method for polishing a substrate, such as a wafer, to planarize a surface of the substrate.

In an embodiment, there is provided a polishing apparatus comprising: a polishing table for supporting a polishing pad; a top ring configured to apply pressures separately to zones on a back surface of a substrate to press a front surface of the substrate against the polishing pad; a film-thickness sensor configured to obtain a film-thickness signal that varies in accordance with a film thickness of the substrate; and a polishing controller configured to manipulate the pressures, the polishing controller is configured to calculate indexes of a remaining film thickness in zones on the front surface of the substrate, manipulate the pressures based on the indexes for controlling a distribution of the remaining film thickness, and update at least one of control parameters using polishing data obtained during polishing of the substrate, the control parameters being used in controlling of the distribution of the remaining film thickness.

In an embodiment, the polishing controller is configured to update the at least one of the control parameters before starting manipulation of the pressures on other substrate which is to be polished after polishing of the substrate.

In an embodiment, the polishing controller is configured to update the at least one of the control parameters during polishing of the substrate.

In an embodiment, the at least one of the control parameters is a parameter included in a process model of a model predictive control, and the polishing controller is configured to update the at least one of the control parameters to minimize square errors between predicted values of the indexes and actually measured values.

In an embodiment, the at least one of the control parameters is a ratio of a changing rate of each index to corresponding one of the pressures.

In an embodiment, the polishing controller is configured to update the at least one of the control parameters based on the indexes and the pressures.

In an embodiment, the film-thickness sensor is an eddy current sensor.

In an embodiment, the film-thickness sensor is an optical sensor.

In an embodiment, there is provided a polishing method comprising: rotating a polishing table supporting a polishing pad; applying pressures separately to zones on a back surface of a substrate to press a front surface of the substrate against the polishing pad to polish the substrate; obtaining a film-thickness signal that varies in accordance with a film thickness of the substrate; calculating indexes of a remaining film thickness in zones on the front surface of the substrate during polishing of the substrate; manipulating the pressures based on the indexes for controlling a distribution of the remaining film thickness; and updating at least one of control parameters using polishing data obtained during polishing of the substrate, the control parameters being used in controlling of the distribution of the remaining film thickness.

In an embodiment, updating the at least one of control parameters comprises updating the at least one of the control parameters before starting manipulation of the pressures on other substrate which is to be polished after polishing of the substrate.

In an embodiment, updating the at least one of control parameters comprises updating the at least one of the control parameters during polishing of the substrate.

In an embodiment, the at least one of the control parameters is a parameter included in a process model of a model predictive control, and updating the at least one of control parameters comprises updating the at least one of the control parameters to minimize square errors between predicted values of the indexes and actually measured values.

In an embodiment, the at least one of the control parameters is a ratio of a changing rate of each index to corresponding one of the pressures.

In an embodiment, updating the at least one of control parameters comprises updating the at least one of the control parameters based on the indexes and the pressures.

According to the above-described embodiments, an excellent control operation for the distribution of remaining film thickness can be realized, regardless of a change in polishing characteristics due to deterioration of consumables and regardless of a change in polishing characteristics during polishing of one wafer. Further, even when the polishing characteristics are relatively stable, controllability can be improved because the polishing characteristics can be more correctly grasped.

BRIEF DESCRIPTION OF THE DRAWINGS

FIG. 4 is graphs showing a reference trajectory of a model predictive control;

FIG. 6 is a flowchart showing a process of identifying a predictive control model using polishing data of a preceding wafer;

FIG. 7 is a flowchart showing a process of identifying a predictive control model using polishing data of a wafer that is being polished;

DESCRIPTION OF EMBODIMENTS

Embodiments will be described below with reference to the drawings.

Figure 1:
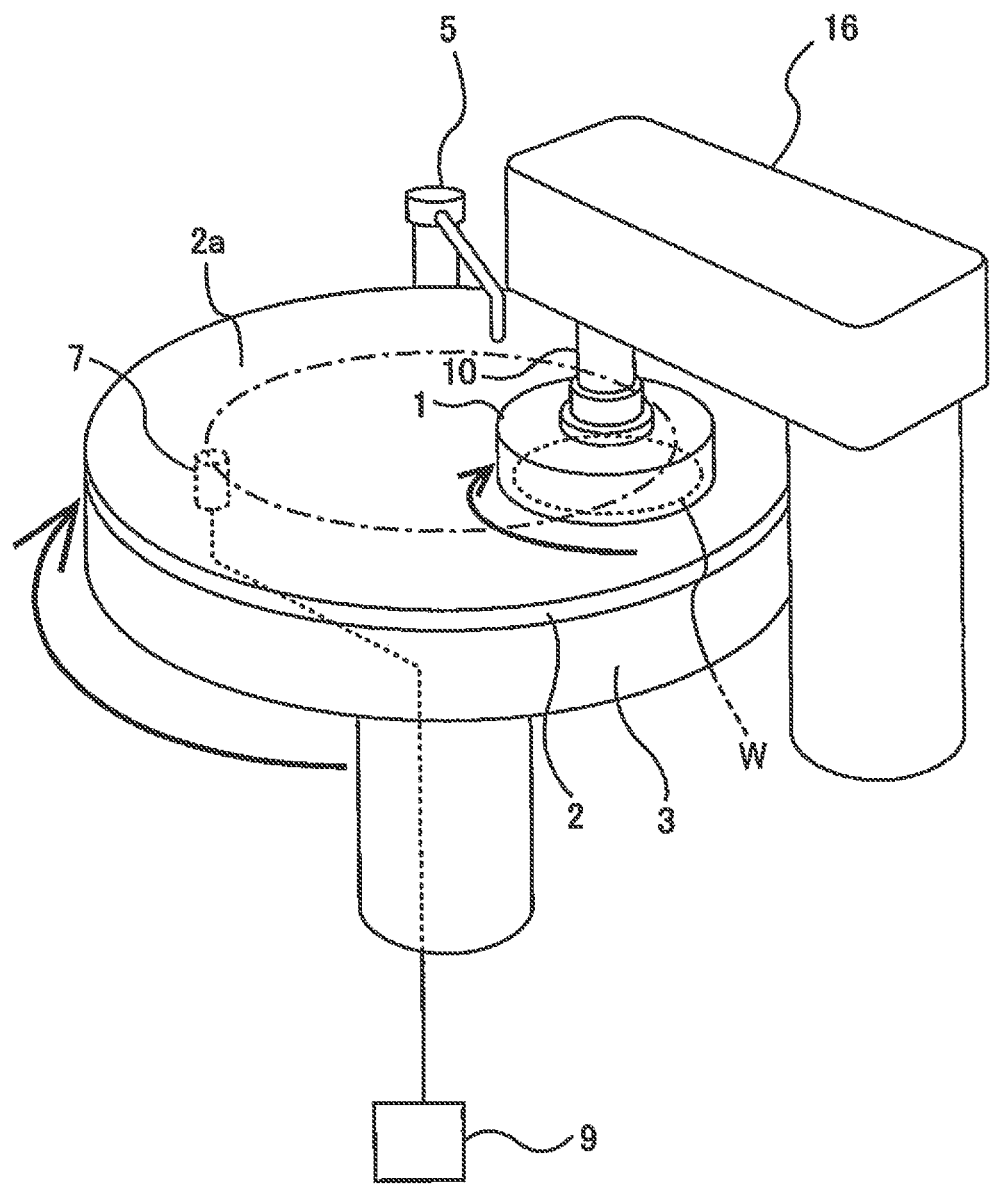
FIG. 1 is a schematic view showing a polishing apparatus for polishing a wafer which is an example of a substrate.

FIG. 1 is a schematic view showing a polishing apparatus for polishing a wafer which is an example of a substrate. As shown in FIG. 1, the polishing apparatus includes a top ring (or a substrate holder) 1 configured to hold and rotate a wafer W, a polishing table 3 for supporting a polishing pad 2, a polishing-liquid supply nozzle 5 for supplying a polishing liquid (or slurry) onto the polishing pad 2, and a film-thickness sensor 7 configured to obtain a film-thickness signal that varies in accordance with a film thickness of the wafer W. The polishing pad 2 has an upper surface that provides a polishing surface 2a for polishing the wafer W.

The top ring 1 is coupled to a lower end of a top ring shaft 10. The top ring shaft 10 has an upper end that is coupled to a rotating device (not shown) disposed in a top ring arm 16. This rotating device is configured to rotate the top ring 1 in a direction indicated by arrow through the top ring shaft 10. The top ring 1 is configured to be able to hold the wafer W on its lower surface by vacuum suction. The film-thickness sensor 7 is located in the polishing table 3, so that the film-thickness sensor 7 can rotate together with the polishing table 3. The film-thickness sensor 7 is configured to obtain the film-thickness signals at multiple zones, including a center, of the wafer W each time the polishing table 3 makes one revolution. The film-thickness sensor 7 may be an optical sensor or an eddy current sensor.

Polishing of the wafer W is performed as follows. The top ring 1 and the polishing table 3 are rotated in the same direction as indicated by arrows, while the polishing liquid is supplied from the polishing-liquid supply nozzle 5 onto the polishing pad 2. In this state, the top ring 1 presses the wafer W against the polishing surface 2a of the polishing pad 2. The surface of the wafer W is polished by a combination of a mechanical action of abrasive grains contained in the polishing liquid and a chemical action of the polishing liquid. The polishing apparatus having such structures is known as CMP (chemical mechanical polishing) apparatus.

During polishing of the wafer W, the film-thickness sensor 7 rotates together with the polishing table 3, and obtains the film-thickness signals while sweeping across the surface of the wafer W. Each of these film-thickness signals is an index value that directly or indirectly indicates the film thickness of the wafer W, and varies in accordance with a decrease in the film thickness of the wafer W. The film-thickness sensor 7 is coupled to a polishing controller 9, so that the film-thickness signal is sent to the polishing controller 9. This polishing controller 9 terminates polishing of the wafer W when the film thickness of the wafer W, indicated by the film thickness signal, has reached a predetermined target value.

Figure 2:
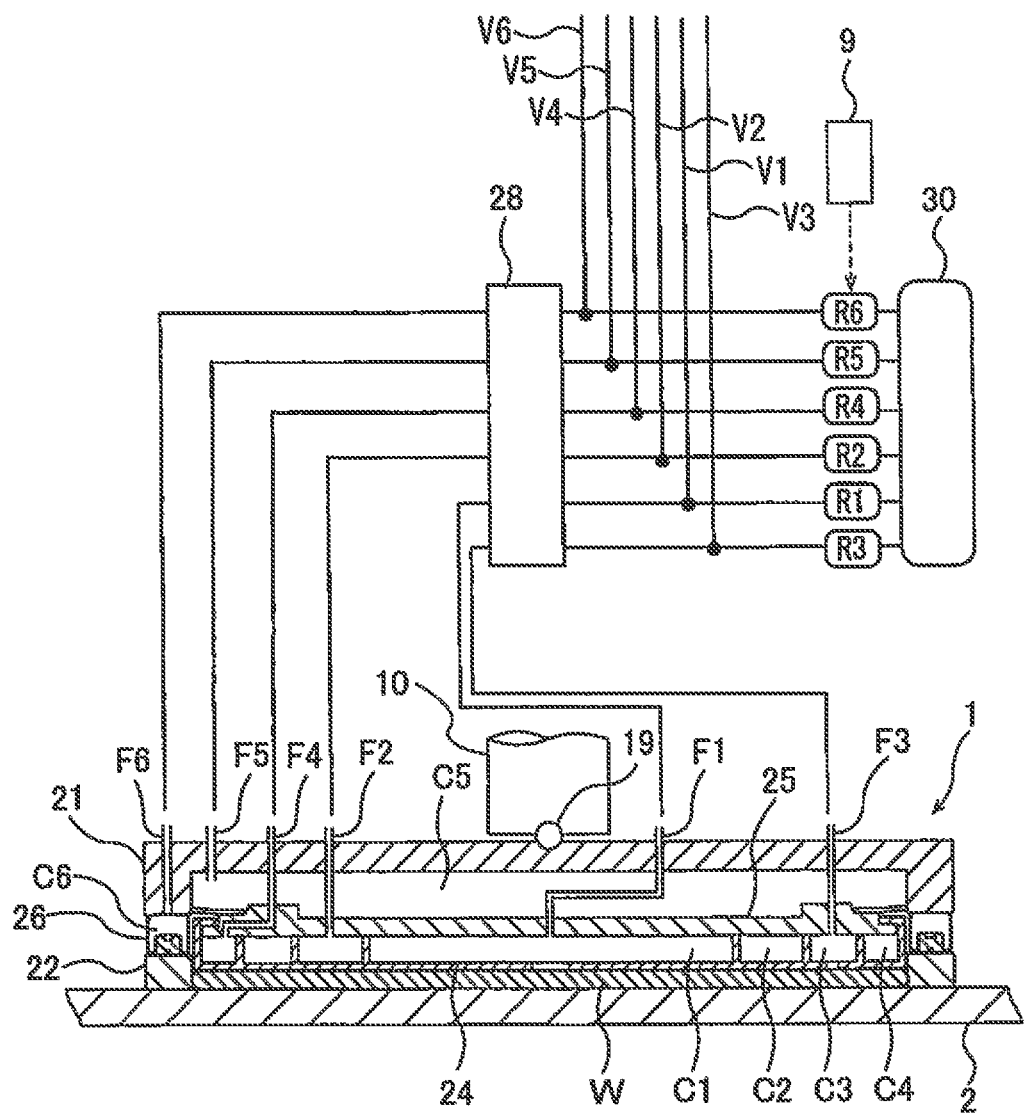
FIG. 2 is a cross-sectional view showing a top ring.

Next, the top ring 1 will be described. FIG. 2 is a cross-sectional view showing the top ring 1. The top ring 1 has a top ring body 21 coupled to the top ring shaft 10 via a universal joint 19, and a retaining ring 22 provided below the top ring body 21.

A flexible membrane (elastic membrane) 24 to be brought into contact with a back surface (a surface at an opposite side of a front surface to be polished) of wafer W and a chucking plate 25 that holds the membrane 24 are disposed below the top ring body 21.

Four pressure chambers C1, C2, C3, and C4 are provided between the membrane 24 and the chucking plate 25. The pressure chambers C1, C2, C3, and C4 are formed by the membrane 24 and the chucking plate 25. The central pressure chamber C1 has a circular shape, and the other pressure chambers C2, C3, and C4 have an annular shape. These pressure chambers C1, C2, C3, and C4 are in a concentric arrangement.

Pressurized gas, such as pressurized air, is supplied through gas delivery lines F1, F2, F3, and F4 into the pressure chambers C1, C2, C3, and C4, respectively, by a gas supply source 30. Vacuum lines V1, V2, V3, and V4 are coupled to the gas delivery lines F1, F2, F3, and F4, respectively, so that negative pressure can be produced in the pressure chambers C1, C2, C3, and C4 by the vacuum lines V1, V2, V3, and V4. The pressures in the pressure chambers C1, C2, C3, and C4 can be changed independently to thereby independently adjust polishing pressures on four zones of the wafer W: a central portion; an inner intermediate portion; an outer intermediate portion; and a peripheral portion.

A pressure chamber C5 is formed between the chucking plate 25 and the top ring body 21. The pressurized gas is supplied through a gas delivery line F5 into the pressure chamber C5 by the gas supply source 30. Further, a vacuum line V5 is coupled to the gas delivery line F5, so that negative pressure can be produced in the pressure chamber C5 by the vacuum line V5. With these operations, the chucking plate 25 and the membrane 24 can move up and down.

The retaining ring 22 is arranged around the peripheral portion of the wafer W so as to prevent the wafer W from coming off the top ring 1 during polishing. The membrane 24 has an opening in a portion that forms the pressure chamber C3, so that the wafer W can be held on the top ring 1 by vacuum suction when a vacuum is produced in the pressure chamber C3. Further, the wafer W can be released from the top ring 1 by supplying nitrogen gas or clean air into the pressure chamber C3.

An annular rolling diaphragm 26 is provided between the top ring body 21 and the retaining ring 22. A pressure chamber C6 is formed in this rolling diaphragm 26, and is in communication with the gas supply source 30 through a gas delivery line F6. The gas supply source 30 supplies the pressurized gas into the pressure chamber C6, so that the rolling diaphragm 26 presses the retaining ring 22 against the polishing pad 2. Further, a vacuum line V6 is coupled to the gas delivery line F6 so that negative pressure can be produced in the pressure chamber C6 by the vacuum line V6. When a vacuum is produced in the pressure chamber C6, the entirety of the retaining ring 22 is elevated.

The gas delivery lines F1, F2, F3, F4, F5, and F6, communicating with the pressure chambers C1, C2, C3, C4, C5, and C6, respectively, are provided with elctropneumatic regulators (which are pressure regulators) R1, R2, R3, R4, R5, and R6, respectively. The pressurized gas from the gas supply source 30 is supplied through the electropneumatic regulators R1 to R6 into the pressure chambers C1 to C6. These electropneumatic regulators R1 to R6 are coupled to the pressure chambers C1 to C6 via the gas delivery lines F1 to F6, which extend from the pressure chambers C1 to C6 through a rotary joint 28 to the electropneumatic regulators R1 to R6.

The electropneumatic regulators R1 to R6 are configured to regulate the pressure in the pressure chambers C1 to C6 by regulating the pressure of the pressurized gas supplied from the gas supply source 30. The electropneumatic regulators R1 to R6 are coupled to the polishing controller 9. The pressure chambers C1 to C6 are further coupled to vent valves (not shown), respectively, so that the pressure chambers C1 to C6 can be ventilated to the atmosphere. The polishing controller 9 sends target pressure values of the respective pressure chambers C1 to C6 to the electropneumatic regulators R1 to R6, which then operate such that the pressures in the pressure chambers C1 to C6 are maintained at the corresponding target pressure values. The polishing controller 9 manipulates the pressures in the pressure chambers C1 to C6 through the electropneumatic regulators (pressure regulators) R1 to R6.

The pressures in the pressure chambers C1 to C6 are measured by pressure sensors (not shown) incorporated in the electropneumatic regulators R1 to R6, respectively. Measured values of the pressure in the pressure chambers C1 to C6 are transmitted to the polishing controller 9. In the example shown in FIG. 2, the four pressure chambers C1 to C4 that push the back surface of the wafer W are provided. Less than four or more than four pressure chambers may be provided.

Figure 3:
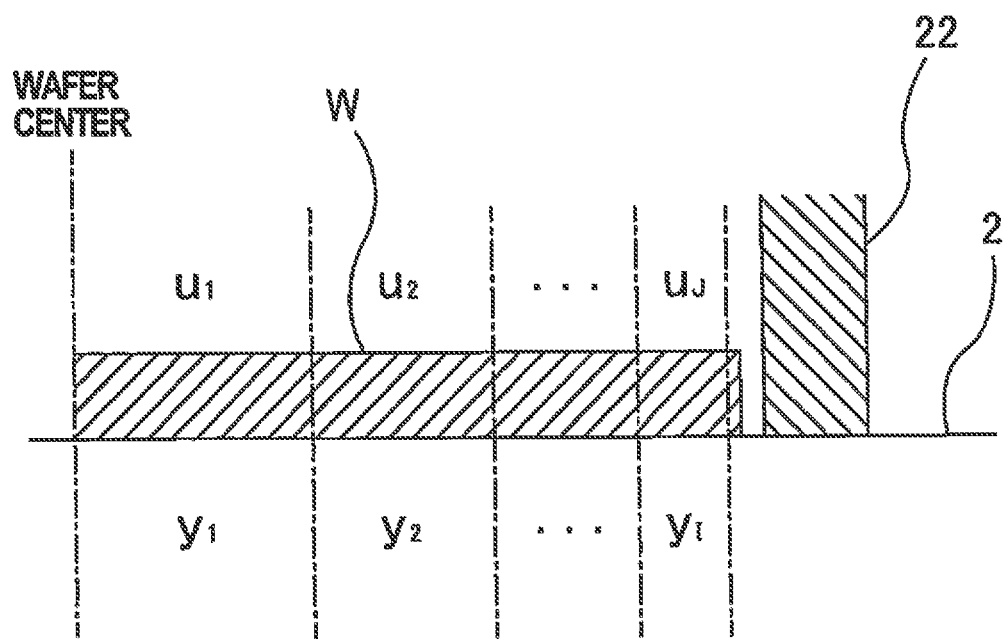
FIG. 3 is a schematic view showing an example in which a wafer surface (i.e., a surface to be polished) is divided into I number of zones.

FIG. 3 is a schematic view showing an example in which the front surface (i.e., the surface to be polished) of the wafer W is divided into I number of zones. These I number of zones are those defined on the front surface of the wafer W, and include one circular zone located at the center of the wafer W and annular zones around the circular zone. As shown in FIG. 3, an index y(k), which relatively indicates a remaining film thickness in each zone, is defined. This index y(k) will be referred to as remaining film index. It is preferable that the remaining film index y(k) decrease linearly in accordance with a decrease in film thickness (see Japanese laid-open patent publication No. 2008-503356).

The remaining film index can be determined by polishing in advance a wafer (a reference wafer) of the same type as a wafer that is an object to be controlled. For example, in a case where the film-thickness signal varies monotonously with the progress of polishing, a remaining time (i.e., a time to a polishing end point) with respect to the film-thickness signal at each point in time throughout polishing of the reference wafer is stored in a tabular form in advance. During polishing of a wafer to be controlled, the remaining film index can be obtained with use of the stored table by converting the film-thickness signal at each point in time into the remaining time that has been obtained when the reference wafer was polished. In the case where the film-thickness sensor 7 is an optical sensor and the film-thickness signal is a spectrum of reflected light from the surface to be polished, spectra of the light from the reference wafer and measured values of the film thickness before and after polishing of the reference wafer are stored in advance. During polishing of a wafer to be controlled, the film thickness of the wafer at each point in time can be estimated from the measured values of the film thickness that were obtained before and after polishing of the reference wafer by determining a spectrum of the reference wafer that is most similar to a spectrum of the wafer, to be controlled, obtained at that point in time. In this manner, the remaining film index y(k) may be an estimated value of the remaining film thickness as it is.

J number of zones, which correspond to the pressure chambers CI to CJ of the top ring 1, are defined on the back surface of the wafer. These J number of zones include one circular zone located at the center of the wafer W and annular zones around the circular zone. The pressure in each zone is uniform. In many cases, the zones defined on the front surface of the wafer and the zones defined on the back surface of the wafer are in one-to-one relation, i.e., I=J. Assuming that a change (or an amount of decrease) in the remaining film index per unit time in each zone on the front surface of the wafer is proportional to the pressure that can vary in J number of ways with a dead time and a first-order lag, the remaining film index y(k) is expressed by the following equation using $f_1$ as an appropriate function.

$$y(k)=y(0)-C \cdot f_1(k, \Delta t, t_D, \alpha, u_0, \Delta u(1), \Delta u(2), \ldots, \Delta u(k-1)) \tag{1}$$

where:

y(k) is the remaining film index and is a column vector having a length of I;

C is a constant of proportionality of a decreasing rate of the remaining film index with respect to pressure, and is expressed as a matrix with I by J (I×J) array;

k is a discrete time (k=0, 1, 2, . . . );

$\Delta t$ is a time increment (or a control period);

$t_D$ is a dead time in the response;

$\alpha$ is a time constant of the response;

$u_0$ is an initial pressure and is a column vector having a length of J; and $\Delta u(k)$ is an amount of change in the pressure at time k and is a column vector having a length of J.

A p-step-ahead predicted value of the remaining film index at time k is expressed using $f_2$ and $f_3$ as appropriate functions as follows.

$$y_P(k, p)=y_O(k, p)+y_F(k, p) \tag{2}$$

$$y_O(k, p)=y(k)-C \cdot f_2(k, \Delta t, t_D, \alpha, u_0, \Delta u(1), \Delta u(2), \ldots, \Delta u(k-1), p) \tag{3}$$

$$y_F(k, p)=-C \cdot f_3(k, \Delta t, t_D, \alpha, \Delta u(k), \Delta u(k+1), \ldots, \Delta u(k+p-1), p) \tag{4}$$

where:

$y_P(k, p)$ is p-step-ahead predicted value of the remaining film index at time k and is a column vector having a length of I;

$y_O(k, p)$ is a determined term that has been determined by a past manipulated variable (pressure) and is a column vector having a length of I; and $y_F(k, p)$ is an undetermined term that is to be determined by a manipulated variable (pressure) after present time and is a column vector having a length of I.

Now, let $Y_P(k, P)$, $Y_O(k, P)$, and $\Delta U_Q$ be expressed as follows.

$$Y_P(k, P) = [y_P(k, 1)^T, y_P(k, 2)^T, \ldots, y_P(k, P)^T]^T \quad (5)$$

$$Y_O(k, P) = [y_O(k, 1)^T, y_O(k, 2)^T, \ldots, y_O(k, P)^T]^T \quad (6)$$

$$\Delta U_Q = [\Delta u(k)^T, \Delta u(k+1)^T, \ldots, \Delta u(k+Q-1)^T]^T \quad (7)$$

Further, using $\Psi$ as an appropriate matrix with an array of $(I \times P) \times (J \times Q)$, a P-step-ahead predicted value of the remaining film index is given by $$Y_P(k, P) = Y_O(k, P) - \Psi \Delta U_Q \quad (8)$$

In order to suppress a change in manipulated variable (pressure) after a sufficient time has elapsed, the following equation is assumed under a condition of $I \le Q \le P$.

$$\Delta u(k+Q) = \Delta u(k+Q+1) = \ldots = \Delta u(k+P-1) = 0 \quad (9)$$

If Q=P, the equation (9) is construed as $\Delta u(k+Q)=0$.

After the above-described preparations are done, a reference trajectory for model predictive control is defined. As shown in FIG. 4, $y_{SO}(k)$ represents a target remaining film index at each time k, and $\beta$ represents a time constant of a predetermined first-order lag. Reference trajectory $Y_R(k, P)$ for the model predictive control is defined as follows.

$$Y_R(k, P) = [y_R(k, 1)^T, y_R(k, 2)^T, \ldots, y_R(k, P)^T]^T \quad (10)$$

$$y_R(k, p) = y_S(k+p) + \exp(-p\Delta t/\beta)[y(k) - y_S(k)] \quad (11)$$

$$y_S(k+p) = [y_{SO}(k+p), y_{SO}(k+p), \ldots, y_{SO}(k+p)]^T \quad (12)$$

The right side of the equation (12) is a column vector having a length of I.

An evaluation function J, which will be described below, is a function for suppressing the change in the manipulated value (pressure) while allowing a controlled variable (i.e., remaining film index) to gradually approach a target trajectory along the reference trajectory. The evaluation function J can be defined as follows.

$$J = \| Y_R(k, P) - Y_P(k, P) \|_{\Gamma T \Gamma}^2 + \| \Delta U_Q \|_{\Lambda T \Lambda}^2 \quad (13)$$
$$= \| Y_R(k, P) - Y_O(k, P) + \Psi \Delta U_Q \|_{\Gamma T \Gamma}^2 + \| \Delta U_Q \|_{\Lambda T \Lambda}^2$$

where $$\| X \|_A^2 = X^T A X \quad (14)$$

$$\Gamma T \Gamma = \begin{pmatrix} \gamma_1^T \gamma_1 & 0 & 0 & \ldots & 0 \\ 0 & \gamma_2^T \gamma_2 & 0 & \ldots & 0 \\ 0 & 0 & \gamma_3^T \gamma_3 & \ldots & 0 \\ & & \ldots & \ldots & \\ 0 & 0 & 0 & \ldots & \gamma_P^T \gamma_P \end{pmatrix} \quad (15)$$

$$\Lambda^T \Lambda = \begin{pmatrix} \lambda_1^T \lambda_1 & 0 & 0 & \ldots & 0 \\ 0 & \lambda_2^T \lambda_2 & 0 & \ldots & 0 \\ 0 & 0 & \lambda_3^T \lambda_3 & \ldots & 0 \\ & & \ldots & \ldots & \\ 0 & 0 & 0 & \ldots & \lambda_Q^T \lambda_Q \end{pmatrix} \quad (16)$$

$\gamma_p$ is a diagonal matrix with I by I ($I \times I$) array that represents a weight on a deviation of the predicted value from the reference trajectory at time k+p, and $\lambda_q$ is a diagonal matrix with J by J ($J \times J$) array that represents a weight on a change in the manipulated variable at time k+q-1.

Generally, there is constraint on the manipulated variable (i.e., the pressure in the pressure chamber). For example, there is provided upper and lower limits, upper and lower limits of amount of a change in one operation, or an upper limit of a pressure difference between neighboring pressure chambers. The manipulated variable $\Delta U_Q$ that minimizes a value of J in the equation (13) can be determined by a quadratic programming which is one of optimization methods.

In the above-discussed model predictive control, parameters, which represent characteristics of the polishing process to be controlled, include the C matrix indicating a ratio of the decreasing rate of the remaining film index to the pressure, the dead time $t_D$ in the response, and the time constant $\alpha$. Row of the C matrix corresponds respectively to the zones defined on the front surface of the wafer, and column of the C matrix corresponds respectively to the pressure chambers. Assignment order of the zones on the front surface of the wafer and assignment order of the pressure chambers are in accordance with the order of increasing a distance from the wafer center.

Generally, the pressure in the pressure chamber affects the polishing rate only in the zone directly pressed by that pressure chamber and other zone adjacent to that zone. Therefore, the C matrix is expressed as a matrix in which diagonal elements and their neighboring elements are positive, while other elements are zero. For example, where I is 4 (I=4) and J is 4 (J=4) and where the pressure in the pressure chamber affects the polishing rate in a zone directly pressed by that pressure chamber and other zone next to that zone, the C matrix is given by $$C = \begin{pmatrix} c_{11} & c_{12} & 0 & 0 \\ c_{21} & c_{22} & c_{23} & 0 \\ 0 & c_{32} & c_{33} & c_{34} \\ 0 & 0 & c_{43} & c_{44} \end{pmatrix} \quad (17)$$

$$c_{ij} \ge 0 \quad (18)$$

Assuming that $c_{ij}$ is zero ($i \ne j$), the C matrix can be determined by polishing in advance a wafer (e.g., sample wafer) having the same specifications as those of a product wafer to be polished, obtaining the pressures in the respective pressure chambers during polishing of the sample wafer, and calculating an average polishing rate (or an average removal rate) in each of the zones.

The dead time $t_D$ contains a mechanical delay of the top ring 1, and delays in a processing operation and a communication of the polishing controller 9 (i.e., a delay from when the film thickness sensor 7 obtains the film-thickness signal to when the pressure on the back surface of the wafer is actually started to change). A filtering process for smoothing the film-thickness signal entails a phase lag, which is reflected in the time constant $\alpha$. It is difficult to conduct a step response test for the pressure in each pressure chamber with use of a product wafer which is an object to be controlled in the polishing apparatus. For this reason, empirically-obtained values are generally used for the dead time $t_D$ and the time constant $\alpha$. In order to improve the controllability, it is important to accurately establish these parameters that represent the processing characteristics (or the polishing characteristics).

Assuming that the dead time $t_D$ and the time constant $\alpha$ are known, one-step-ahead predicted value of the remaining film index y(k) is expressed from the equations (3), (4) with use of $f_4$ as an appropriate function, as follows.

$$y_P(k, 1) = y(k) - C \cdot f_4(k, \Delta t, t_D, \alpha, u_0, \Delta u(1), \Delta u(2), \ldots, \Delta u(k)) \quad (19)$$

Assuming that the control period Δt is constant and substituting $\mu_{tD,\alpha}(k)$ into parentheses following C in the right side of the equation (19), the predicted value $y_p(k, 1)$ is expressed as $$y_P(k, 1) = y(k) - C\mu_{tD,\alpha}(k) \quad (20)$$

where $\mu_{tD,\alpha}(k)$ is a column vector having J number of elements determined from the known parameters and the manipulated variable up to present time k.

An error e(k) between the one-step-ahead predicted value and an actually measured value is given as $$e(k) = y_P(k, 1) - y(k+1) = -C\mu_{tD,\alpha}(k) - \Delta y(k) \quad (21)$$

where $\Delta y(k) = y(k+1) - y(k)$.

Now, a focus is turned to the zone on the front surface of the wafer. An i-th element of the vector e(k) and an i-th element of the vector Δy(k) will be expressed as $e_i(k)$, $\Delta y_i(k)$, respectively. Further, a row vector, constituted by i-th row of the C matrix but excluding elements that are to be obviously zero, will be expressed as $c_i$, and a column vector, constituted by the vector $\mu_{tD,\alpha}(k)$ from which only an element corresponding to $c_i$ has been removed, will be expressed as $-v_{tD,\alpha}(k)$. The i-th element $e_i(k)$ is expressed as $$e_i(k) = v_{tD,\alpha}(k)^T c_i^T - \Delta y_i(k) \quad (22)$$

where i=1, 2, ..., I.

With respect to a zone i, A and b are defined based on data with respect to time $k=k_1, k_2, \ldots, k_n, \ldots, k_N$ that have been extracted during polishing, as follows.

$$A = -[v_{tD,\alpha}(k_1), v_{tD,\alpha}(k_2), \ldots, v_{tD,\alpha}(k_n), \ldots, v_{tD,\alpha}(k_N)]^T \quad (23)$$

$$b = [\Delta y_i(k_1), \Delta y_i(k_2), \ldots, \Delta y_i(k_n), \ldots, \Delta y_i(k_N)]^T \quad (24)$$

An error ε of one-step-ahead predicted value is expressed as $$\epsilon[e_i(k_1), e_i(k_2), \ldots, e_i(k_n), \ldots, e_i(k_N)]^T \quad (25)$$

This error ε is expressed using the above-defined A and b, as follows.

$$\epsilon = Ac_i^T - b \quad (26)$$

Since $c_i$ is considered to be equal to or larger than zero ($c_i \leq 0$) as described above, the vector $c_i$ that minimizes a mean square error of the one-step-ahead predicted value of the remaining film index can be determined as non-negative least square constraint issue with use of known method. Therefore, it is possible to optimize proportionality-constant matrix C.

In the above-discussed embodiment, the ratio of the remaining film index to the pressure in the prediction model is identified from the polishing data on the assumption that the dead time $t_D$ and the time constant α are known. However, it is noted that, even if the dead time $t_D$ and the time constant α are unknown, it is possible to apply the same method. Specifically, another embodiment may include the steps of estimating a first range in which the dead time $t_D$ can fall, estimating a second range in which the time constant α can fall, creating multiple combinations of the dead time $t_D$ and the time constant α by varying the dead time $t_D$ and the time constant α with appropriate increments within the first range and the second range, optimizing the proportionality-constant matrix C with respect to each of the combinations in the same process as described above, determining one combination that can minimize an one-step-ahead estimated error of the remaining film index, and using the proportionality-constant matrix C, the dead time to, and the time constant α that constitute the determined combination, thereby forming a new process model.

In the above-discussed embodiment, the remaining film index y(k) is defined as an index that decreases with a decrease in the film thickness, and the matrix C is defined as the ratio of the decreasing rate of the remaining film index to the pressure. However, it is also possible to define the index y(k), which indicates the thickness of the remaining film, as a quantity that increases with the decrease in the film thickness, e.g., the number of revolutions of the polishing table 3 when polishing the reference wafer. In this case, the matrix C is formulated as a constant of proportionality of an increasing rate of the remaining film index with respect to the pressure.

Figure 5A:
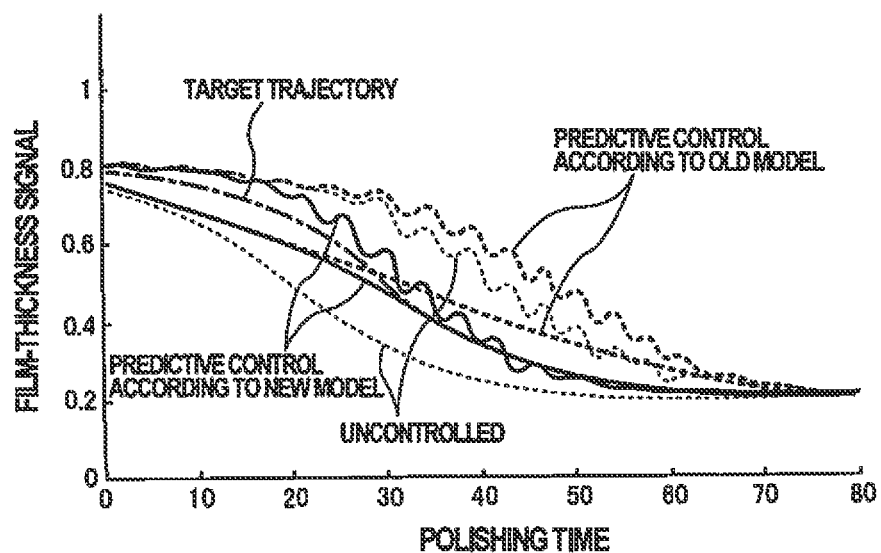
FIG. 5A and FIG. 5B are diagrams showing results of simulation that was conducted by virtually polishing one wafer using parameters for a prediction model which is different from an actual state, identifying a process model using polishing data of this polishing process to update the parameters, and applying the updated parameters to polishing control for another wafer.
Figure 5B:
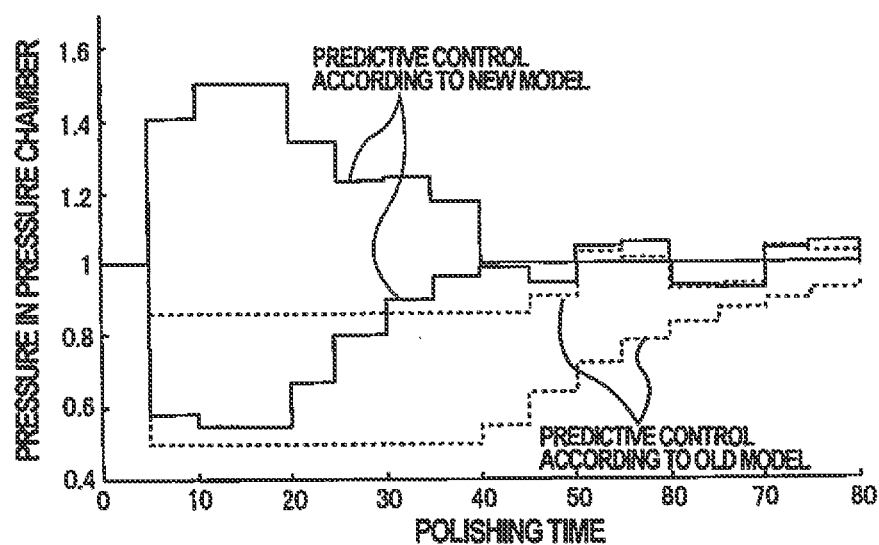

FIG. 5A and FIG. 5B are diagrams showing a result of simulation that was conducted by virtually polishing one wafer using parameters for a prediction model which is different from an actual state, identifying a process model using polishing data of this polishing process to update the parameters, and applying the updated parameters to a control operation in polishing of another wafer. The polishing data obtained include the pressure in the pressure chamber during polishing, the film-thickness signal from the film thickness sensor 7, and the remaining film index. In this simulation, the film thickness sensor 7 was an eddy current sensor. Therefore, the film-thickness signal outputted from the film thickness sensor 7 was assumed to decrease non-linearly with the decrease in the film thickness. Further, because a variation in the film thickness along a circumferential direction of a wafer is typically expected to exist, vibration was added to the film-thickness signal in this simulation so that the film-thickness signal was vibrated at a constant period with amplitude that increases as the film thickness sensor 7 comes closer to an edge of the wafer.

FIG. 5A shows a temporal change in the film-thickness signal at the center and the edge of the wafer, and FIG. 5B shows a temporal change in the pressure in the pressure chamber while the control was performed. In an initial prediction model, the constant of proportionality C was assumed to be three times an actual value, and the dead time $t_D$ and the time constant α were assumed to be one-third of respective actual values. As a result, the controlled variable (i.e., the difference in film thickness between the zones) and the manipulated variable (i.e., the pressure in the pressure chamber) converged very slowly. In contrast, according to the embodiment, polishing data of a first wafer was used to identify the process model, and the parameters were updated. As a result, the polishing control was greatly improved and the controlled variable (i.e., the difference in film thickness between the zones) and the manipulated variable converged rapidly, although each parameter was not exactly agreement with true value. A small fluctuation of the manipulated variable (i.e., the pressure in the pressure chamber) was observed in a latter half of the polishing operation, but this fluctuation is due to the assumed variation in the film thickness on the wafer edge along the circumferential direction of the wafer. This small fluctuation can be removed by smoothing the film-thickness signal values, e.g., by performing a moving average on the film-thickness signal values.

FIG. 6 is a flowchart showing a process of updating a part of the control parameters for a subsequent wafer, i.e., a process of identifying a predictive control model, using polishing data of a preceding wafer. First, the subsequent wafer is transported to the polishing apparatus shown in FIG. 1 (step 1). The polishing controller 9 reads from a storage device 40 the control parameters that have been determined using the polishing 16 data of the preceding wafer (step 2). Polishing of the subsequent wafer is then started (step 3). During polishing of the subsequent wafer, the polishing controller 9 calculates the remaining film indexes for the zones on the wafer, respectively, and controls a distribution of the thickness of the remaining film based on the remaining film indexes (step 4). More specifically, the polishing controller 9 manipulates the pressures (i.e., the pressures in the pressure chambers) applied to the respective zones on the back surface of the wafer, based on the remaining film indexes calculated for the respective zones. In this step 4, in an initial control operation, the distribution of the thickness of the remaining film is controlled based on the control parameters that have been read in the step 2. As discussed previously, in an initial polishing stage, the polishing characteristics (e.g., the polishing rate with respect to the pressure) may be unstable because of a change in characteristic of an exposed layer to be polished. In such a case, a predetermined waiting time may be provided between a polishing start point and the initial control operation. The control parameters that have been updated based on the polishing data of the preceding wafer may not be read before polishing of the subsequent wafer is started, and may be read before the initial control operation is performed.

The polishing controller 9 determines whether polishing of the wafer is to be terminated or not based on the remaining film index (step 5). If the remaining film index has reached a preset target value, the polishing controller 9 terminates polishing of the wafer (step 6). In the step 5 and the step 6, it is also possible to terminate polishing of the wafer based on whether or not a predetermined time has elapsed from a polishing start point. Further, the polishing controller 9 identifies a process model using the polishing data of the wafer (step 7), updates the control parameters (stop 8), and stores the updated control parameters in the storage device 40 (step 9).

The method according to the above-discussed embodiment is effective in a case where the polishing characteristics are varied over a relatively long time, due to wear of the polishing pad or other causes. Further, the method according to the embodiment can be applied to polishing of one wafer during which the polishing characteristics (processing characteristics) are varied due to a change in characteristic of an exposed layer to be polished or a change in temperature. Specifically, as shown in FIG. 7, it is possible to extract polishing data obtained in a preceding polishing section (or time interval having a predetermined length) at each point in time during polishing, and to determine the control parameters for the predictive control process model in the same manner as discussed above. Thereafter, the polishing control is continued based on the newly-determined control parameters. Since the polishing characteristics are expected to vary during polishing of a wafer, it is preferable to store in the storage device 40 the control parameters that have been determined by the identification of the process model at an initial polishing stage, and use the stored control parameters as initial values of the control parameters in polishing of a subsequent wafer.

In FIG. 7, a subsequent wafer is transported to the polishing apparatus shown in FIG. 1 (step 1). The polishing controller 9 reads from the storage device 40 the control parameters that have been determined using the polishing data of the preceding wafer (step 2). Polishing of the subsequent wafer is then started (step 3). During polishing of the subsequent wafer, the polishing controller 9 calculates the remaining film indexes for the zones on the wafer, respectively, and controls a distribution of the thickness of the remaining film based on the remaining film indexes (step 4). More specifically, the polishing controller 9 manipulates the pressures (i.e., the pressures in the pressure chambers) applied to the respective zones on the back surface of the wafer, based on the remaining film indexes calculated for the respective zones. In this step 4, in an initial control operation, the distribution of the thickness of the remaining film is controlled based on the control parameters that have been read in the step 2. As discussed previously, in an initial polishing stage, the polishing characteristics (e.g., the polishing rate with respect to the pressure) may be unstable because of a change in characteristic of an exposed layer to be polished. In such a case, a predetermined waiting time may be provided between a polishing start point and the initial control operation. The control parameters that have been updated based on the polishing data of the preceding wafer may not be read before polishing of the subsequent wafer is started, and may be read before the initial control operation is performed.

The polishing controller 9 obtains polishing data during polishing of the wafer, identifies a process model using the polishing data, and determines the control parameters again (step 5). The polishing controller 9 determines whether polishing of the wafer has just been started or not, i.e., whether the control parameters are determined for the first time in polishing of the present wafer (stop 6). If polishing of the wafer has just been started, the polishing controller 9 stores the newly-determined polishing parameters in the storage device 40 (step 7) and updates the polishing parameters (step 8). If the polishing characteristics are unstable right after the polishing of the wafer has been started and as a result the control operation in the step 4 is delayed, the operations of the step 5 to the step 7 are also delayed. In this case, the control parameters are newly determined based on the polishing data that have been obtained after the polishing characteristics become stable, and are then stored in the storage device 40. If a certain time has already elapsed since polishing of the wafer is started, the polishing controller 9 updates the control parameters without storing the control parameters (step 8). The polishing controller 9 determines whether polishing of the wafer is to be terminated or not based on the remaining film index (step 9). If the remaining film index has reached a preset target value, the polishing controller 9 terminates polishing of the wafer (step 10). In the step 9 and the step 10, it is also possible to terminate polishing of the wafer based on whether or not a predetermined time has elapsed from a polishing start point.

In the case where the above-described C matrix can be regarded as a diagonal matrix, i.e., in the case where elements, other than diagonal terms, are small and can be replaced with zero, the C matrix can be determined more easily. An operation of updating i-th diagonal element $c_{ii}$ is performed using data that have been obtained in a past section dating back from discrete time k by M times the control period (i.e., by a period $M\Delta t$). A decreasing rate R of the remaining film index and an average pressure $u_{ai}$ in the pressure chamber in this period $M\Delta t$ are given by $$R = [y_i(k - M) - y_j(k)]/M\Delta t \quad (27)$$

$$u_{si} = \frac{1}{M} \cdot \sum_{m=1}^{M} u_i(k - m) \quad (28)$$

The diagonal element $c_{ii}(k)$ at discrete time k is expressed as follows.

$$c_{ii}(k) = R/u_{ai} \quad (29)$$

In the case where the remaining film index $y_i$ is given through the smoothing process, such as the moving average, it is preferable to smooth the pressure in the pressure chamber in the same smoothing process. In consideration of the response lag δ of the remaining film index $y_i$ with respect to the pressure $u_{xi}$ in the pressure chamber, the equation (28) may be rewritten as $$u_{si} = \frac{1}{M} \cdot \sum_{M=1}^{M} u_i(k - m - \delta) \tag{30}$$

Figure 8A:
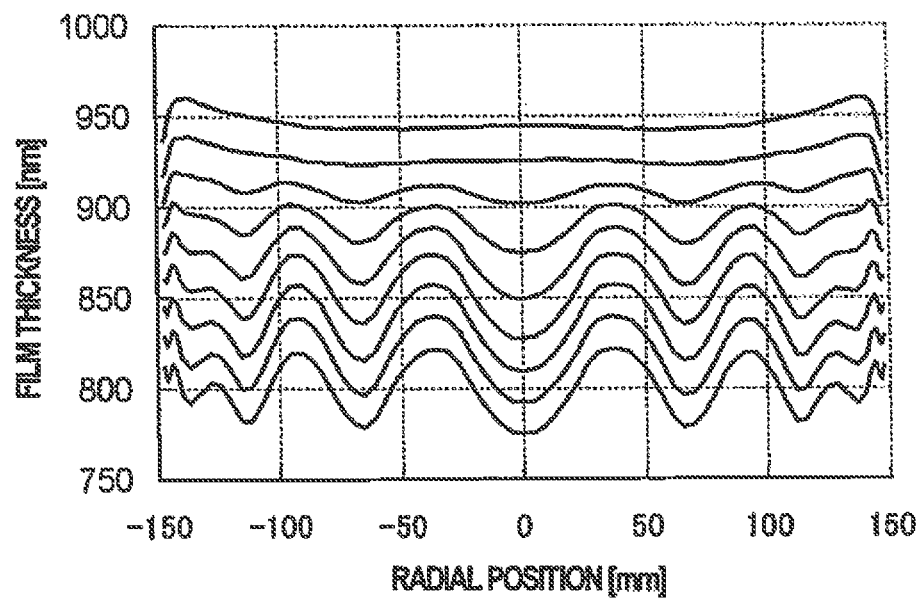
FIG. 8A and FIG. 8B are diagrams each showing results of polishing of a blanket wafer having a blanket of an oxide film while controlling a film-thickness distribution.
Figure 8B:
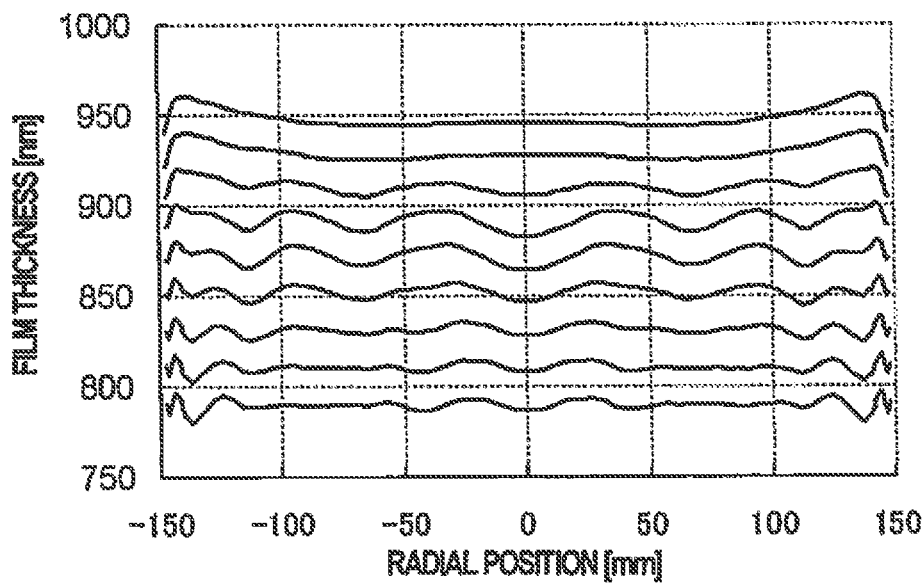

The following are descriptions of polishing experiments that have been conducted in order to confirm the usefulness of the technique discussed above. FIG. 8A and FIG. 8B are diagrams each showing results of polishing of a blanket wafer having a blanket of an oxide film while controlling a film-thickness distribution, and each shows a change in the film-thickness distribution in a radial direction of the wafer during polishing that has been estimated based on the signal from a spectral film-thickness sensor 7. The top ring 1 used in the experiments had eight pressure chambers and was configured to be able to apply pressures separately to the wafer. The ratio (initial value) of the decreasing rate of the remaining film index to the pressure in the pressure chamber in the predictive control model was intentionally varied such that the ratio in odd-numbered zones was about −30% of an estimated value obtained in advance through polishing of a sample wafer and the ratio in even-numbered zones was about +30% of the estimated value. The odd-numbered zones are wafer zones whose number of arrangement order from a wafer center is an odd number, and the even-numbered zones are wafer zones whose number of arrangement order from the wafer center is an even number.

FIG. 8A shows control results in a case where the above-described ratio was constant. For example, in the odd-numbered zones, such as a central zone of the wafer, since this ratio was undervalued, the loading pressure was excessively large, resulting in a great decrease in the film thickness at a latter half of the polishing process, while in the even-numbered zones, since the ratio was overvalued, the loading pressure was excessively small, resulting in a small decrease in the film thickness. In contrast, FIG. 8B shows control results in a case where the ratio was changed in accordance with the equation (29) based on data obtained during polishing. As can be seen from FIG. 8B, an approximately flat distribution of the film thickness was obtained even in the latter half of the polishing process.

Figure 9:
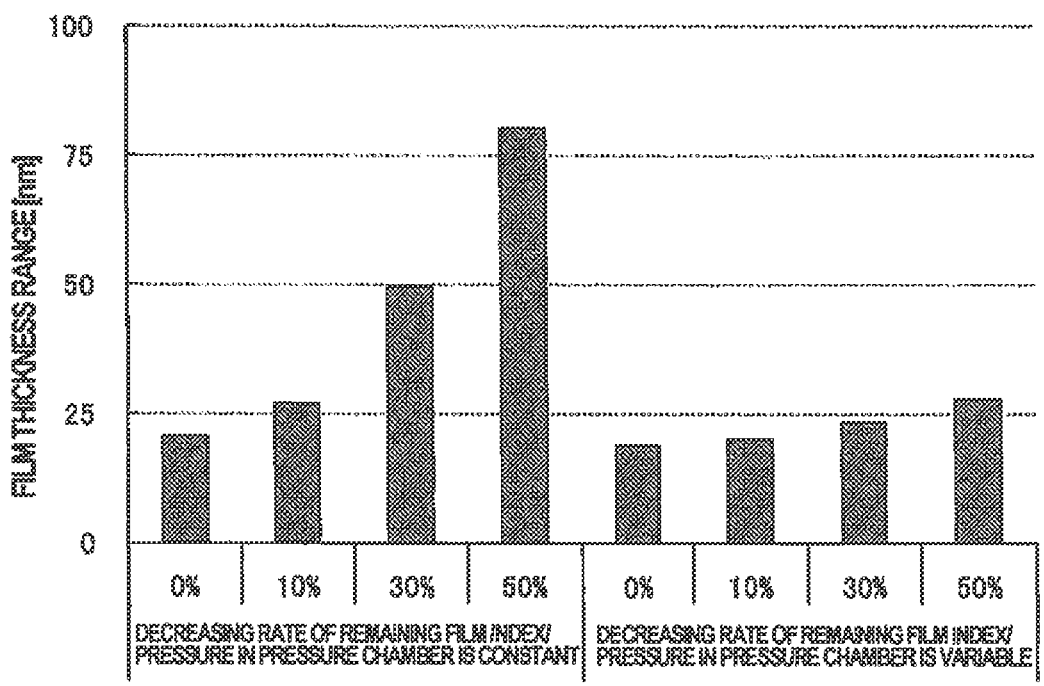
FIG. 9 is a graph showing results of a film-thickness range over a surface of a wafer that was polished while a ratio of a decreasing rate of a remaining film-thickness index to pressure in a predictive control model was kept constant and while the ratio was changed.

FIG. 9 is a graph showing results of a film-thickness range over a surface of a wafer that was polished while the ratio (initial value) of the decreasing rate of the remaining film index to the pressure in the pressure chamber in the predictive control model was changed in four ways within a range of 0% (unchanged) to ±50%, i.e., while the ratio was kept constant or changed during polishing. The film thickness of the polished wafer was measured by a film-thickness measuring device (not shown).

In the case where the ratio was constant, the film-thickness range of the polished wafer became extremely greater in accordance with an amount of intentional change in the ratio. In contrast, in the where the ratio was updated based on the polishing data obtained during polishing, the film-thickness range was greatly improved, as can be seen in the graph. In addition, even in the case where the ratio was not varied intentionally, a variation in the remaining film thickness became smaller in a case where the ratio was updated during polishing than in a case where the ratio was constant. Therefore, the ratio of the decreasing rate of the remaining film thickness to the pressure can be estimated more accurately and can be reflected in the polishing control operation even in the case where the polishing characteristics become relatively stable in the polishing process.

If the ratio of the decreasing rate of the remaining film thickness to the pressure in the pressure chamber is evaluated in a short section (or in a short time interval), a reliability of a newly-calculated ratio may be low due to some causes, such as a variation of data. In such a case, the following solutions may be employed.

A weighted average between a present value and a newly-calculated value is used.

If a difference between a present value and a newly-calculated value is extremely large, the newly-calculated value is not used.

An upper limit and a lower limit of the ratio are provided.

A limit of an amount of change from a present value is provided.

The above-discussed embodiments are directed to a technique of updating the control parameters using the polishing data when the model predictive control is used to control the distribution of the remaining film thickness, but can also be used to update control parameters in other control methods as well. For example, when a PID control is used, the change in the ratio of the decreasing rate of the remaining film thickness in each zone to the pressure in the pressure chamber can be evaluated using the equation (27) through the equation (29), so that a proportional gain, which has been determined initially, can be updated successively based on the evaluation.

According to the above-described embodiments, a good control operation for the distribution of the remaining film thickness can be realized, regardless of the change in the polishing characteristics due to deterioration of consumables and regardless of the change in the polishing characteristics during polishing of one wafer. Further, even when the polishing characteristics are relatively stable, the controllability can be improved because the polishing characteristics can be more correctly grasped.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing apparatus comprising:
a polishing table for supporting a polishing pad;
a top ring configured to apply pressures separately to zones on a back surface of a substrate to press a front surface of the substrate against the polishing pad;
a film-thickness sensor configured to obtain a film-thickness signal that varies in accordance with a film thickness of the substrate; and
a polishing controller configured to manipulate the pressures,
the polishing controller is configured to calculate indexes of a remaining film thickness in zones on the front surface of the substrate, manipulate the pressures based on the indexes for controlling a distribution of the remaining film thickness, and update at least one of control parameters using polishing data obtained during polishing of the substrate, the control parameters being used in controlling of the distribution of the remaining film thickness, the at least one of control parameters comprising a ratio of a changing rate of each index to corresponding one of the pressures.

2. The polishing apparatus according to claim 1, wherein the polishing controller is configured to update the at least one of the control parameters before starting manipulation of the pressures on other substrate which is to be polished after polishing of the substrate.

3. The polishing apparatus according to claim 1, wherein the polishing controller is configured to update the at least one of the control parameters during polishing of the substrate.

4. The polishing apparatus according to claim 1, wherein:
the at least one of the control parameters is a parameter included in a process model of a model predictive control; and
the polishing controller is configured to update the at least one of the control parameters to minimize square errors between predicted values of the indexes and actually measured values.

5. The polishing apparatus according to claim 1, wherein the polishing controller is configured to update the at least one of the control parameters based on the indexes and the pressures.

6. The polishing apparatus according to claim 1, wherein the film-thickness sensor is an eddy current sensor.

7. The polishing apparatus according to claim 1, wherein the film-thickness sensor is an optical sensor.

8. A polishing method comprising:
rotating a polishing table supporting a polishing pad;
applying pressures separately to zones on a back surface of a substrate to press a front surface of the substrate against the polishing pad to polish the substrate;
obtaining a film-thickness signal that varies in accordance with a film thickness of the substrate;
calculating indexes of a remaining film thickness in zones on the front surface of the substrate during polishing of the substrate;
manipulating the pressures based on the indexes for controlling a distribution of the remaining film thickness; and
updating at least one of control parameters using polishing data obtained during polishing of the substrate, the control parameters being used in controlling of the distribution of the remaining film thickness, the at lest one of control parameters comprising a ratio of a changing rate of each index to corresponding one of the pressures.

9. The polishing method according to claim 8, wherein updating the at least one of control parameters comprises updating the at least one of the control parameters before starting manipulation of the pressures on other substrate which is to be polished after polishing of the substrate.

10. The polishing method according to claim 8, wherein updating the at least one of control parameters comprises updating the at least one of the control parameters during polishing of the substrate.

11. The polishing method according to claim 8, wherein:
the at least one of the control parameters is a parameter included in a process model of a model predictive control; and
updating the at least one of control parameters comprises updating the at least one of the control parameters to minimize square errors between predicted values of the indexes and actually measured values.

12. The polishing method according to claim 8, wherein updating the at least one of control parameters comprises updating the at least one of the control parameters based on the indexes and the pressures.

* * * * *